United States Patent [19]

Zhao et al.

[11] Patent Number: 6,100,184

[45] Date of Patent: Aug. 8, 2000

[54] METHOD OF MAKING A DUAL DAMASCENE INTERCONNECT STRUCTURE USING LOW DIELECTRIC CONSTANT MATERIAL FOR AN INTER-LEVEL DIELECTRIC LAYER

[75] Inventors: Bin Zhao, Irvine, Calif.; Prahalad K. Vasudev, Austin, Tex.; Ronald S. Horwath, Santa Clara; Thomas E. Seidel, Sunnyvale, both of Calif.; Peter M. Zeitzoff, Austin, Tex.

[73] Assignees: Sematech, Inc., Austin, Tex.; Lucent Technologies Inc., Murray Hill, N.J.

[21] Appl. No.: 08/914,995

[22] Filed: Aug. 20, 1997

[51] Int. Cl.$^7$ ................................................. H01L 21/4763
[52] U.S. Cl. .......................... 438/638; 438/622; 438/623; 438/627; 438/643; 438/636; 438/637; 438/638; 438/648; 438/653; 438/656; 438/672; 438/685; 438/687; 438/902
[58] Field of Search ...................................... 438/622, 623, 438/627, 637, 638, 639, 640, 666, 668.6, 672, 643, 678, 685, 902, 629, 636, 648, 653, 656, 687

[56] References Cited

U.S. PATENT DOCUMENTS

| | | | |
|---|---|---|---|
| 4,789,648 | 12/1988 | Chow et al. | 437/225 |
| 5,635,423 | 6/1997 | Huang et al. | 437/195 |
| 5,695,810 | 12/1997 | Dubin et al. | 427/96 |
| 5,731,245 | 3/1998 | Joshi et al. | 438/705 |
| 5,739,579 | 12/1997 | Chiang et al. | 257/635 |
| 5,753,967 | 5/1998 | Lin | 257/635 |

OTHER PUBLICATIONS

"A Novel Sub–Half Micron Al–Cu Via Plug Interconnect Using Low Dielectric Constant Material as Inter–Level Dielectric", Zhao et al., IEEE Electron Device Letters, vol. 18, No. 2, Feb. 1997, pp. 57–59.

"Low Capacitance Multilevel Interconnection Using Low–e Organic Spin–on Glass for Quarter–Micron High–Speed ULSIs", Furusawa et al., 1995 Symposium on VLSI Technology Digest of Technical Papers, pp. 59–60.

"Low–k Organic Spin–on Materials in a Non–Etchback Interconnect Strategy", J. Waeterloos et al., DUMIC Conference, Feb. 20–21, 1996, pp. 52–59.

"Integration of BPDA–PDA Polyimide with Two levels of AL(Ci) Interconnects", Wetzel et al., 1995 Material Research Society Symposium Proceedings, vol. 381, pp. 217–229.

"A Novel 0.25 um Via Plug Process Using Low Temperature CVD AL/TiN", Dixit et al., Dec. 10–13, 1995, International Electron Devices Meeting, pp. 10.7.1–10.7.3.

"Single Step PVD Planarized Aluminum Interconnect with Low–e Organic ILD for High Performance and Low Cost ULSI", Zhao et al., 1996 Symposium on VLSI Technology Digest of Technical Papers, pp. 72–73.

"A Highly Reliable Low Temperature Al–Cu Linve/Via Metallization for Sub–Half Micrometer CMOS", Joshi et al., IEEE Electron Device Letters, vol. 16, No. 6, Jun. 1995, pp. 233–235.

"A Planarized Multilevel Interconnect Scheme with Embedded Low–Dielectric–Constant Polymers for Sub–Quarter–Micron Applications", Jeng et al., 1994 Symposium on VLSI Technology Digest of Technical Papers, pp. 73–74.

"On Advanced Interconnect Using Low Dielectricl Constant Materials as Inter–Level Dielectrics", Zhao et al., 1996, Material Research Society Symposium Proceedings vol. 427, pp. 415–427.

"Electromigration Reliability of Tungsten and Aluminum Vias and Improvements Under AC Current Stress", Tao et al., IEEE Transactions on Electron Devices, vol. 40, No. 8, Aug. 1993, pp. 1398–1405.

"Planar Copper–Polyimide Back End of the Line Interconnections for ULSI Devices," B. Luther et al., 1993 VMIC Convference, Jun. 8–9, 1993, pp. 15–21.

Pending Patent Application titled, "Use of Cobalt Tungsten Phosphide as a Barrier Material for Copper Metallization", Serial No. 08/754,600, filed Nov. 20, 1996.

*Primary Examiner*—John F. Niebling
*Assistant Examiner*—David A. Zarneke

[57] ABSTRACT

A technique for fabricating a dual damascene interconnect structure using a low dielectric constant material as a dielectric layer or layers. A low dielectric constant (low-∈) dielectric material is used to form an inter-level dielectric (ILD) layer between metallization layers and in which via and trench openings are formed in the low-∈ ILD. The dual damascene technique allows for both the via and trench openings to be filled at the same time.

12 Claims, 6 Drawing Sheets

METHOD OF MAKING A DUAL DAMASCENE INTERCONNECT STRUCTURE USING LOW DIELECTRIC CONSTANT MATERIAL FOR AN INTER-LEVEL DIELECTRIC LAYER

BACKGROUND OF THE INVENTION

1. Field of the Invention

The present invention relates to the field of semiconductor wafer processing and, more particularly, to a technique for fabricating a dual damascene interconnect structure in which low dielectric constant dielectric layers are used for the inter-level dielectric.

2. Background of the Related Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Likewise, the size of interconnect structures will also need to shrink, in order to accommodate the smaller dimensions. Thus, as integrated circuit technology advances into the sub-0.25 micron range, more advanced interconnect architecture and new materials are required.

One such architecture is a dual damascene integration scheme in which a dual damascene structure is employed. The dual damascene process offers an advantage in process simplification by reducing the process steps required to form the vias and trenches for a given metallization level. The openings, for the wiring of a metallization level and the underlying via connecting the wiring to a lower metallization level, are formed at the same time. The procedure provides an advantage in lithography and allows for improved critical dimension control. Subsequently, both the via and the trench can be filled utilizing the same metal-filling step, thereby reducing the number of processing steps required. Because of the simplicity of the dual damascene process, newer materials can now cost-effectively replace the use of the existing aluminum/$SiO_2$ (silicon dioxide) scheme.

One such newer material is copper. The use of copper metallization improves performance and reliability over aluminum, but copper introduces additional problems which are difficult to overcome when using known techniques for aluminum. For example, in conventional aluminum interconnect structures, a barrier layer is usually not required between the aluminum metal line and an $SiO_2$ inter-level dielectric (ILD). However, when copper is utilized, copper must be encapsulated from the surrounding ILD, since copper diffuses/drifts easily into the adjoining dielectric. Once the copper reaches the silicon substrate, it will significantly degrade the device's performance.

In order to encapsulate copper, a barrier layer of some sort is required to separate the copper from the adjacent material(s). Because copper encapsulation is a necessary step requiring a presence of a barrier material to separate the copper, other materials can now be substituted for the $SiO_2$ as the material for ILD. Replacing the $SiO_2$ by a low-dielectric constant (low-∈) material reduces the interline capacitance, thereby reducing the RC delay, cross-talk noise and power dissipation in the interconnect. However, it is generally necessary to have a barrier (or liner) present between the interconnect and the low-∈ ILD to prevent possible interaction between the interconnect and the low-∈ ILD and also to provide adhesion between them. This barrier is desirable even when aluminum is utilized for the interconnect.

There are generally two types of low-∈ films for integrated circuit applications. One group is comprised of the modified $SiO_2$ materials, such as fluorinated oxide (add limited F into $SiO_2$) and silsesquioxane (add limited H or C-based organic elements to $SiO_2$). The other group is comprised of the organic materials, such as polyimides and polymers, having completely different molecular structures in comparison to $SiO_2$. One advantage of organic low-∈ films is that they offer a lower dielectric constant than the modified $SiO_2$ materials.

One known technique of utilizing organic low-∈ dielectric material for damascene interconnect is described in "Planar Copper-Polyimide Back End Of The Line Interconnections For ULSI Devices;" B. Luther et al.; 1993 VMIC Conference; Jun. 8–9, 1993; pp. 15–21. However, the technique described is for a single damascene process. The present invention describes the use of low-∈ dielectric material in a dual damascene process for use as an ILD.

SUMMARY OF THE INVENTION

The present invention describes a technique for fabricating a dual damascene interconnect structure using a low dielectric constant material as a dielectric layer or layers. A low dielectric constant (low-∈) dielectric material is used to form an inter-level dielectric (ILD) layer between metallization layers and in which via and trench openings are formed in the low-∈ ILD. The dual damascene technique allows for both the via and trench openings to be filled at the same time. In the preferred embodiment, an organic low-∈ dielectric material is selected.

A dielectric separation layer is deposited over an underlying conductive region, which can be another interconnect or a doped region. Next, a first low-∈ dielectric ILD layer is deposited followed by a first dielectric etch-stop layer. Then, a via window is formed in the first etch-stop layer. Subsequently, a second low-∈ dielectric ILD layer is deposited, followed by a second dielectric etch-stop layer. Next, a trench window is formed in the second etch-stop layer.

In the preferred embodiment, the low-∈ layers are formed from an organic material. The two etch-stop layers are comprised of a different material from the dielectric separation layer, in order to allow for high etch selectivity. The low-∈ dielectric ILD layers are anisotropically etched to remove the low-∈ material under the openings. The etching step etches the low-∈ material to form the via and trench openings. Next, the exposed portion of the first dielectric layer at the bottom of the via opening is etched to expose the underlying conductive region.

Subsequently, the via and trench openings are filled with a conductive material. With the preferred embodiment, a conformal barrier or encapsulation layer is first deposited, followed by a metal fill, such as copper or aluminum. Chemical-mechanical polishing is then utilized to polish away the excess metal residing above the trench region.

In an alternative embodiment, when copper is used for metallization, a selective deposition process is employed on the underlying interconnect. The selective deposition of a barrier material allows for a formation of a barrier cap only over the exposed copper, so that the blanket deposition of the dielectric separation layer is not needed.

DETAILED DESCRIPTION OF THE PREFERRED EMBODIMENTS

A technique for fabricating a dual damascene interconnect structure using a low dielectric constant material as a dielectric layer or layers is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well known techniques and structures have not been described in detail in order not to obscure the present invention. It is to be noted that the present invention is described in reference to a dual damascene interconnect structure in which aluminum or copper is used as the metal for the interconnect. However, it is appreciated that other structures and conductive materials can be readily implemented without departing from the spirit and scope of the present invention.

Figure 1:
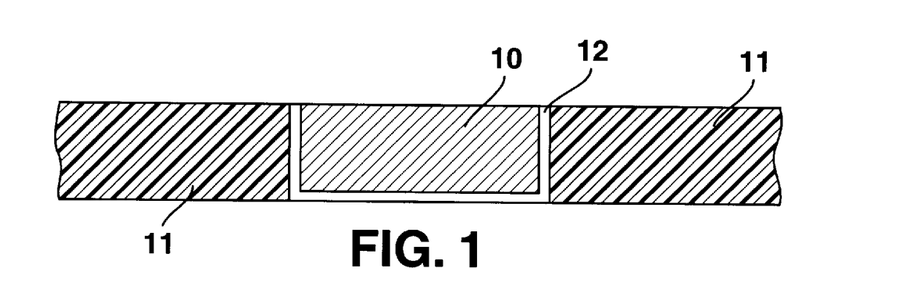
FIG. 1 is a cross-sectional view of a conductive region formed within a dielectric layer and in which an interconnect structure of the preferred embodiment is subsequently fabricated thereon.

Referring to FIG. 1, it shows a formation of an interconnect structure in which a conductive region 10 resides within a dielectric layer 11. The conductive region 10 is comprised of a conductive material which can be of any of a variety of materials used for forming interconnects on a semiconductor wafer, such as a silicon wafer. Typically, a metal, such as aluminum (Al) or its alloy, is used for forming the conductive regions on a wafer. The dielectric layer 11 is formed from a dielectric material, which is typically used to form an inter-level dielectric (ILD) layer. An ILD layer is used to separate two metallization levels on a semiconductor wafer.

The conductive region 10 (hereinafter also referred to as interconnect 10) formed in the dielectric layer 11 is shown in the Figure as a wiring interconnect. Wiring interconnects are conductive regions formed within trenches and provide the wiring (or lines) for a given metallization layer on a semiconductor wafer. It is appreciated that another type of interconnect is a plug interconnect, which is a conductive region formed within a via and provides the interconnection between the different metallization levels. Aluminum has been used extensively for both trenches and vias. Other metals, such as tungsten, have been used as well for vias.

A more recent practice is the use of copper to replace aluminum. Since copper has higher resistance to electromigration and lower electrical resistivity than aluminum, it is a more preferred material for interconnect wiring than aluminum. In addition, copper has lower resistivity than tungsten or aluminum, making copper a desirable metal for use in forming plugs. However, because of its diffusion property in the dielectric material and incompatibility with silicon materials, copper requires encapsulation to isolate it from most adjacent materials.

Thus, when copper is employed as an interconnect material, some form of barrier or encapsulation layer is required to prevent the copper from interacting with the surrounding material. This is a requirement, whether the adjacent material is fabricated from a silicon-based dielectric or a low-∈ dielectric material. As for aluminum, a liner layer 12 of some sort is desirable as well, when the adjacent material is formed from a low-∈ dielectric. The liner layer 12 functions as an adhesion promoter layer or a combination of barrier/adhesion promoter layer between the aluminum and the low-∈ dielectric material. Accordingly, whether the conductive region 10 is comprised of either aluminum or copper, some form of intervening liner layer 12 is needed to function as an adhesion promoter layer or a barrier layer that also functions as an adhesion promoter layer (hereinafter, it is understood that a barrier layer also provides adhesion promotion as well). Copper requires a barrier layer. Aluminum only requires an adhesion promoter layer, if the aluminum does not interact with the surrounding material. In the event aluminum does interact with the surrounding material, a barrier layer is required.

Accordingly, the example shown in FIG. 1 is described having either copper or aluminum as the material comprising the conductive region (or interconnect) 10. It is appreciated that the interconnect 10 can be comprised of other materials as well and is not limited to just copper and aluminum. As shown, region 10 is part of a lower metallization layer (wiring interconnect), however, it is appreciated that the region 10 can be a plug interconnect or a doped region for the practice of the present invention. The dielectric layer 11 can be comprised of an oxide (such as silicon dioxide ($SiO_2$)), nitride or a low-$\in$ dielectric. In the example, it is presumed that the dielectric material of layer 11 will be a low-$\in$ dielectric, since that is the preferred material for ILDs in the practice of the present invention. Furthermore, in the preferred embodiment, the low-$\in$ dielectric selected is an organic low-$\in$ dielectric material.

Since encapsulation of copper is necessary to prevent or inhibit copper diffusion into the surrounding dielectric layer 11, a barrier layer (also referred to as encapsulation or isolation layer) is used for the liner layer 12, when copper is used as the material comprising conductive region 10. The liner layer 12 in the example structure can be formed from a variety of known barrier materials, including TiN, Ta, TaN, W, WN, SiN and WSiN. Again, it is appreciated that these materials also operate as an adhesion promoter. Generally, TiN or TaN is preferred when the interconnect 10 is comprised of copper.

If the conductive region 10 is comprised of aluminum, the liner layer 12 can be a barrier layer or just an adhesion promoter layer (not having barrier properties), depending on the interaction of the aluminum to the surrounding material. A variety of known materials, including TiN, TiSiN, Ta, TaN, TaSiN, WN, $SiO_2$, SiN, $Al_2O_3$, SiC and SiON, for example, can be used as a barrier/adhesion promoter material. Titanium can also be used strictly as an adhesion promoter material. It is also appreciated that the liner layer 12 can be comprised of multiple layers. For example, a barrier material formed above an adhesion promoter layer.

A variety of known techniques can be used to fabricate the structure shown in FIG. 1. One such technique is a single-damascene structure described in the earlier-mentioned reference entitled "Planar Copper-Polyimide Back End Of The Line Interconnections For ULSI Devices;" B. Luther et al.; 1993 VMIC Conference; Jun. 8–9, 1993; pp. 15–21. Furthermore, it is appreciated that the region underlying the interconnect 10 (although not shown) can be a conductive, dielectric or semiconductive region, which can be the wafer substrate itself. It is also appreciated that the example shown is that of a trench region of a lower metallization layer. Accordingly, FIG. 1 illustrates the starting structure upon which the various layers are formed to fabricate an interconnect structure of the present invention.

Figure 2:
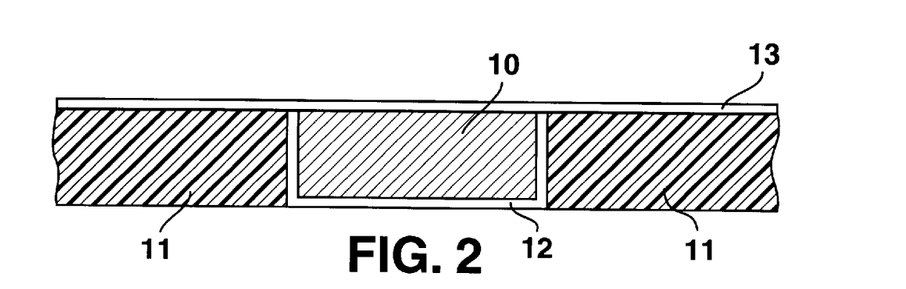
FIG. 2 is a cross-sectional view showing a deposition of a dielectric separation layer onto the structure of FIG. 1.

Referring to FIG. 2, a dielectric separation layer 13 is deposited over the interconnect 10 and dielectric layer 11 (the dielectric layer 11 is henceforth referred to as an ILD layer 11 in order to differentiate the various dielectric layers being described). A variety of dielectric materials can be used to form the dielectric separation layer 13 to separate the structure of FIG. 1 from the subsequently deposited overlying low-$\in$ material. If the conductive region 10 is comprised of copper, then region 10 will need to be encapsulated. Accordingly, a barrier material, from the list of barrier materials described previously in reference to the liner layer 12, is used to form a barrier as layer 13. If the conductive region 10 is comprised of aluminum, then layer 13 can be a barrier or an adhesion promoter layer, or both. In the preferred embodiment, silicon nitride (SiN) is deposited by chemical-vapor deposition (CVD) to an approximate thickness of 300–1000 angstroms when copper is used. When the conductor is aluminum, SiN or $SiO_2$ is deposited by CVD to an approximate thickness of 300–1000 angstroms. A primary purpose of the separation layer 13 is to cap the exposed conductive region 10 for the subsequent ILD deposition. Functionally, the separation layer 13 functions equivalently to the liner layer 12 in isolating or separating the conductive material from the adjacent ILD.

Figure 3:
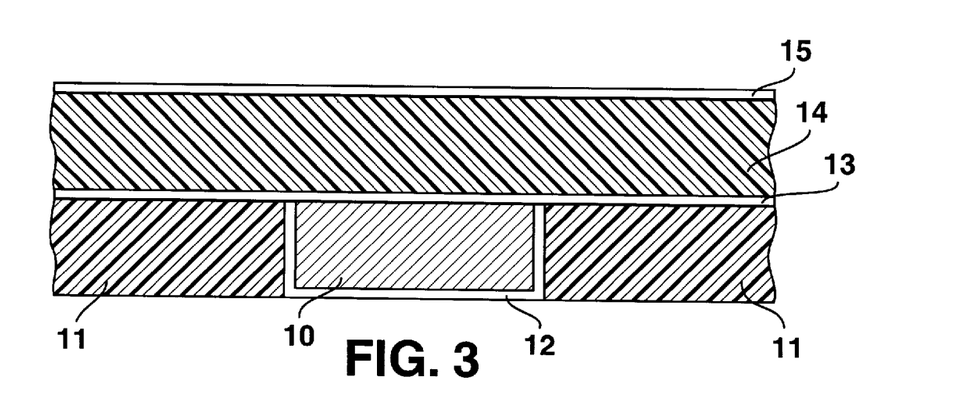
FIG. 3 is a cross-sectional view showing a deposition of a first low-∈ dielectric ILD layer over the structure of FIG. 2 and a subsequent deposition of a first dielectric etch-stop layer over the first ILD layer.

Subsequently, as shown in FIG. 3, a first low-dielectric constant (low-$\in$) dielectric layer 14 (hereinafter also referred to as the ILD layer 14) is deposited over the dielectric separation layer 13. The low-$\in$ dielectric ILD layer 14 of the preferred embodiment is comprised of an organic low-$\in$ material. Examples of such organic low-$\in$ dielectric material are polyimide, fluorinated polyimide, parylene, poly-arylethers, fluorinated poly-arylethers and other polymers. However, this is not an inclusive list and other low-$\in$ dielectric materials can be used as well. The low-$\in$ layer 14 is preferably deposited by CVD or a spin-on process to an approximate thickness of 5000–10,000 angstroms.

Next, another dielectric layer, referenced as an etch-stop layer, 15 is deposited over the low-$\in$ ILD layer 14. In the example, $SiO_2$ is deposited by a CVD process to an approximate thickness of 300–1000 angstroms. As explained below, it is important that the material selected for the etch-stop layer 15 is different from that comprising the separation layer 13.

Figure 4:
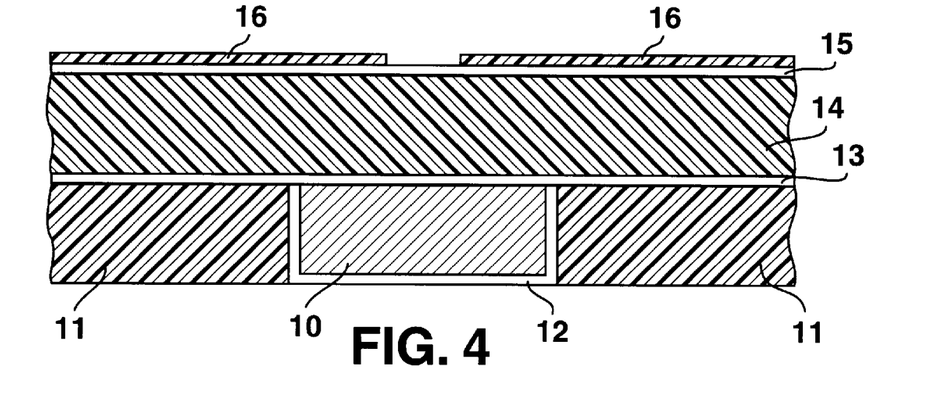
FIG. 4 is a cross-sectional view showing a deposition of a patterned photoresist layer atop the structure of FIG. 3, in which a widow opening is formed to expose a portion of the underlying etch-stop layer.

Then, as shown in FIG. 4, photoresistive material 16 is deposited, exposed and developed by the use of known techniques to form an opening to define a subsequent via hole opening. Thus, the photolithography technique exposes the location where portions of the dielectric layer 15 is to be etched. Next, a plasma etch step is utilized to remove the exposed portion of the dielectric layer 15 to form an opening 17. Accordingly, the pattern in the photoresist layer 16 is transferred to the dielectric layer 15 for forming the opening 17. Later, the opening 17 will define a location where the via hole opening is to be formed in the underlying low-$\in$ layer 14.

Figure 5:
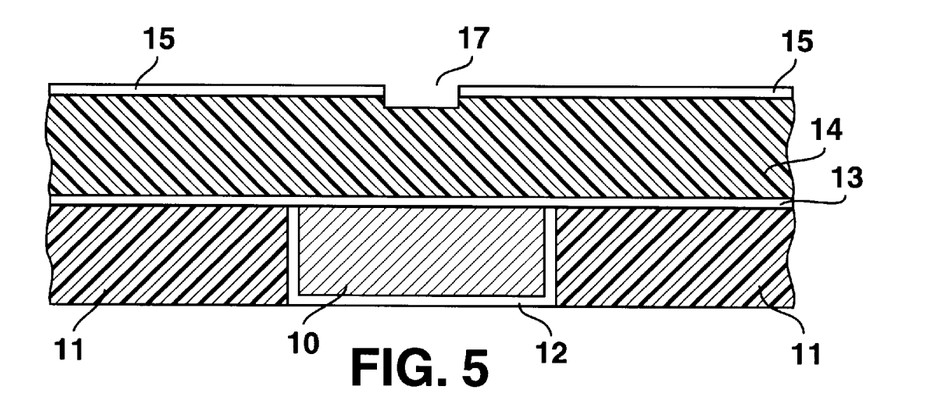
FIG. 5 is a cross-sectional view showing the widow opening pattern of FIG. 4 being transferred on to the first etch-stop layer to define a via opening.

Subsequently, an anisotropic photoresist strip etch using $O_2$ plasma is used to remove the remaining photoresistive material 16. As an example, a high-density plasma etch utilizing low pressure, typically less than 5 mTorr can be used for this step. The resulting structure is shown in FIG. 5. It is to be noted that the photoresist strip step can cause the removal of some of the low-$\in$ material of layer 14 residing below the opening 17, as shown in FIG. 5. However, since another low-$\in$ material layer will be deposited and planarized, such partial etching of the low-$\in$ material at the particular location is not a concern.

Figure 6:
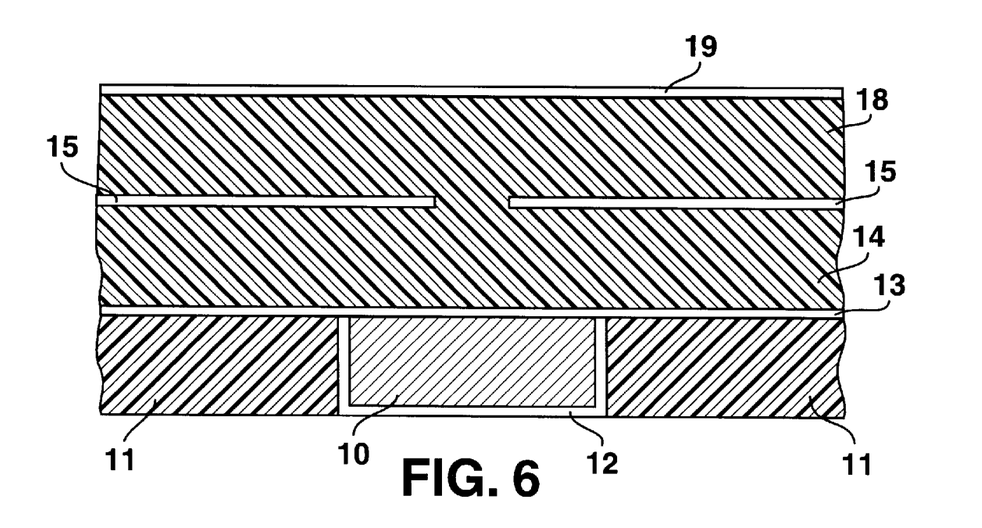
FIG. 6 is a cross-sectional view showing a deposition of a second low-∈ dielectric ILD layer over the structure of FIG. 5 and a subsequent deposition of a second etch-stop layer over the second ILD dielectric layer.

Next, as shown in FIG. 6, a second low-$\in$ dielectric layer 18 (hereinafter also referred to as the ILD layer 18) is deposited. This second low-$\in$ ILD layer 18 is equivalent to the first low-$\in$ ILD layer 14 in the material and the technique in which it is formed. A typical thickness for the ILD layer 18 is in the approximate range of 3000–8000 angstroms.

Then, another dielectric layer, referenced as a second etch-stop layer 19, is deposited. It is again important to note that this second etch-stop layer 19 be comprised of a different material than the dielectric separation layer 13. However, the etch-stop layer 19 can be comprised of the same material as the first etch-stop layer 15. In the preferred embodiment, the two etch-stop layers are comprised from the same material, but this material must be different from the material comprising the separation layer 13. In the preferred embodiment $SiO_2$ is used as the material for etch-stop layers 15 and 19. The dielectric etch-stop layer 19 thickness is in the approximate range of 300–1000 angstroms.

What is important to note is that in forming a dual damascene structure, the via to the underlying conductive region 10 is formed in the first low-∈ ILD layer 14, while the trench is formed above the via in the second low-∈ ILD layer 18. Accordingly, the three dielectric layers 13, 15 and 19 form the boundaries for the two ILD layers 14 and 18. The first and second etch-stop layers 15 and 19 should have high etch selectivity in respect to the low-∈ ILD layers 14 and 18. Furthermore, since a portion of the dielectric separation layer 13 will need to be etched later, the two etch-stop layers 15 and 19 should also have high etch selectivity with respect to the separation layer 13, as noted previously.

Figure 7:
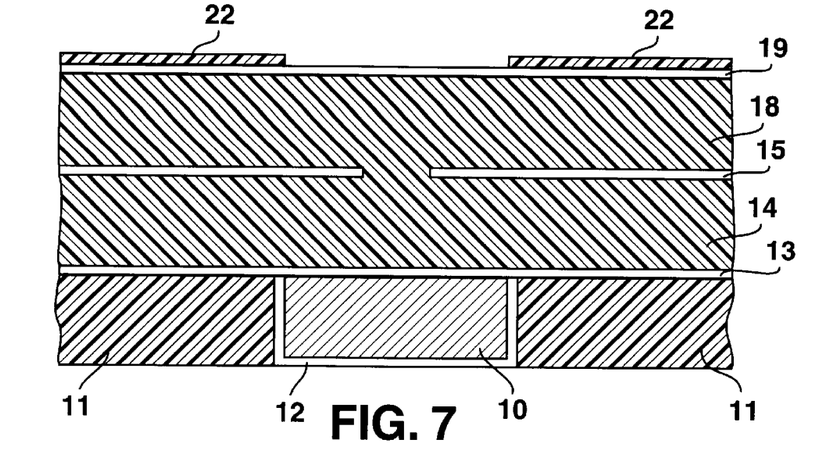
FIG. 7 is a cross-sectional view showing a deposition of a patterned photoresist layer atop the structure of FIG. 6, in which another window opening is formed to expose a portion of the underlying second etch-stop layer.
Figure 8:
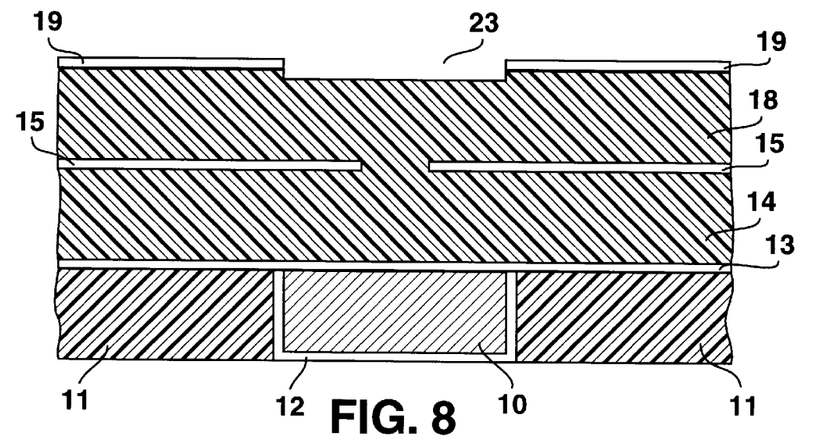
FIG. 8 is a cross-sectional view showing the window opening pattern of FIG. 7 being transferred on to the second etch-stop layer to define a trench opening.

Next, as shown in FIG. 7, photoresistive material 22 is deposited, exposed and developed by the use of known techniques to form an opening to define a subsequent trench opening. Thus, the photolithography technique exposes the location where portions of the etch-stop layer 19 is to be etched. Then, a plasma etch step is utilized again to remove the exposed portion of the etch-stop layer 19 to form an opening 23 (shown in FIG. 8). Accordingly, the pattern in the photoresist layer 22 is transferred to the etch-stop layer 19 for forming opening 23. The opening 23 will define a location where the trench opening is to be formed in the underlying low-∈ ILD layer 18. Subsequently, an anisotropic photoresist strip etch using $O_2$ plasma (equivalent to the step previously described for removing layer 16) is used to remove the remaining photoresistive material 22. The resulting structure is shown in FIG. 8.

Figure 9:
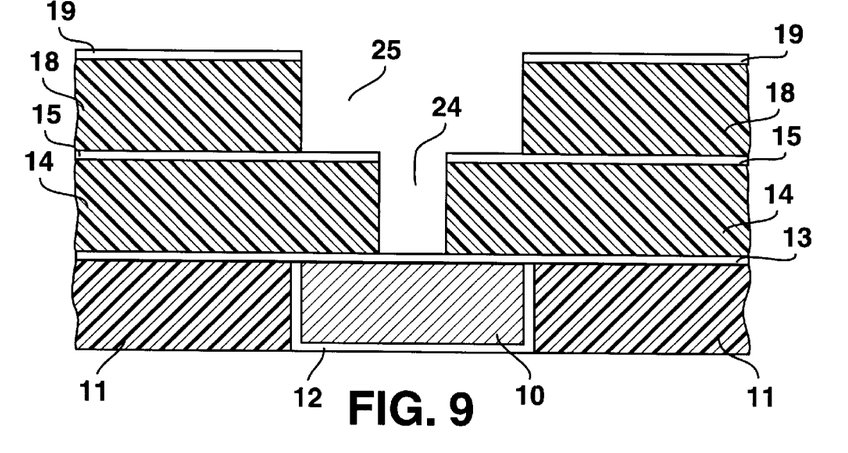
FIG. 9 is a cross-sectional view showing an anisotropic etching of the first and second low-∈ dielectric ILD layers of FIG. 8 in which the etching is performed through the trench and via openings.

However, instead of stopping the high density plasma, low-pressure $O_2$ plasma etch at this point, the process is continued until the structure shown in FIG. 9 is achieved. This anisotropic etch will continue to etch the exposed low-∈ material in both of the ILD layers 14 and 18, but will not etch away the dielectric etch-stop layers 15 and 19. The two etch-stop layers 15 and 19 function as etch-stops for the anisotropic etch of the low-∈ dielectric material, so that only the exposed ILD region underlying the two openings 17 and 23 are etched. Thus, the resulting structure is a dual damascene structure illustrated in FIG. 9.

The structure shown in FIG. 9 is comprised of two layers of low-∈ ILD material, having a via hole opening 24 and a trench opening 25. The via and trench openings 24 and 25 correspond to the openings 17 and 23, respectively. In the particular example shown in FIG. 9, both openings 24 and 25 overly the interconnect 10. Also in this example, the dielectric separation layer 13 is still intact at the bottom of the via 24.

Subsequently, the etch chemistry is changed to etch the exposed portion of the separation layer 13 at the bottom of the via 24. The etch chemistry selected must be highly selective so that it will etch the exposed barrier or adhesion promoter material of the separation layer 13 at the bottom, but will not etch the two etch-stop layers 15 and 19 and the ILD material underlying them. This is the reason why the etch-stop layers 15 and 19 need to be comprised of a different material(s) than that selected for the separation layer 13. Thus, by the proper selection of the dielectric materials, such etch selectivity can be obtained.

Figure 10:
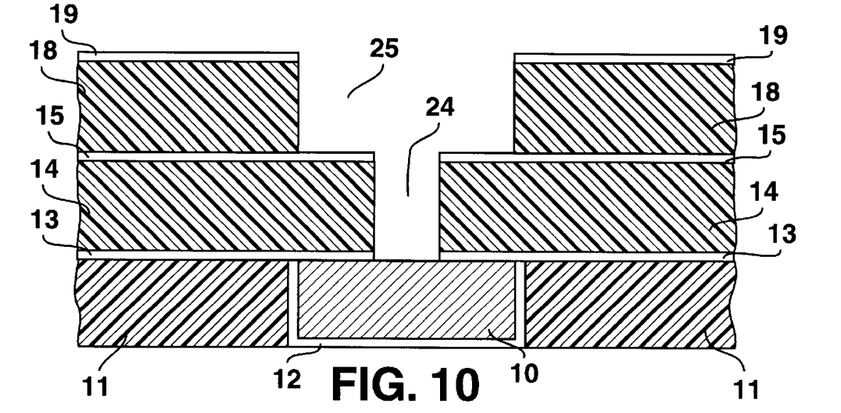
FIG. 10 is a cross-sectional view showing an etching of the exposed separation layer at the bottom of the via opening shown in FIG. 9.

In the preferred embodiment, SiN is selected for the material comprising the separation layer 13 and $SiO_2$ is selected as the material comprising the two etch-stop layers 15 and 19. A $CH_3F/O_2$ anisotropic etch chemistry is employed to etch away the exposed SiN material of layer 13, but the $SiO_2$ material of the layers 15 and 19 will not be etched. The presence of the $SiO_2$ etch-stop layers protects the underlying low-∈ dielectric material from being etched away by the $O_2$ component of the etch chemistry. The resulting structure after this etching step is shown in FIG. 10. Generally, it is preferred at this stage to perform a similar anisotropic $O_2$ etch clean as previously mentioned to remove polymers at the bottom of the via (which may be generated during the layer 13 etch at the bottom of the via 24) and also to remove any photoresist that may remain on the surface. This type of clean is preferred since most organic low-∈ materials are not compatible to wet cleans. The remaining material of layers 15 and 19 ensure that the underlying low-∈ material will not be etched during the anisotropic $O_2$ clean etch.

Next, a barrier material is conformally deposited to form a barrier (or encapsulation) layer 28 along the exposed surface of the structure of FIG. 10. In the preferred embodiment, the barrier layer is comprised of a metallic material. A purpose of the barrier layer 28 is to provide a barrier between the surrounding low-∈ material of ILD layers 14 and 18 and the copper or aluminum material which will fill in the via and trench openings. Since the conductive region 10 is exposed at the bottom of the via opening 24, the barrier layer 28 also provides a barrier between it and the material filling in the overlying via 24 if such a barrier is required. A variety of known barrier materials can be utilized, in which the barrier material is deposited to an approximate thickness of 100–1000 angstroms. In the preferred embodiment, TiN or TaN is selected as the barrier metal for copper or aluminum fill. It is appreciated that the barrier layer 28 is functionally equivalent to the aforementioned liner layer 12. Accordingly, The previous description relating to the liner layer 12 applies to the layer 28 as well.

Figure 11:
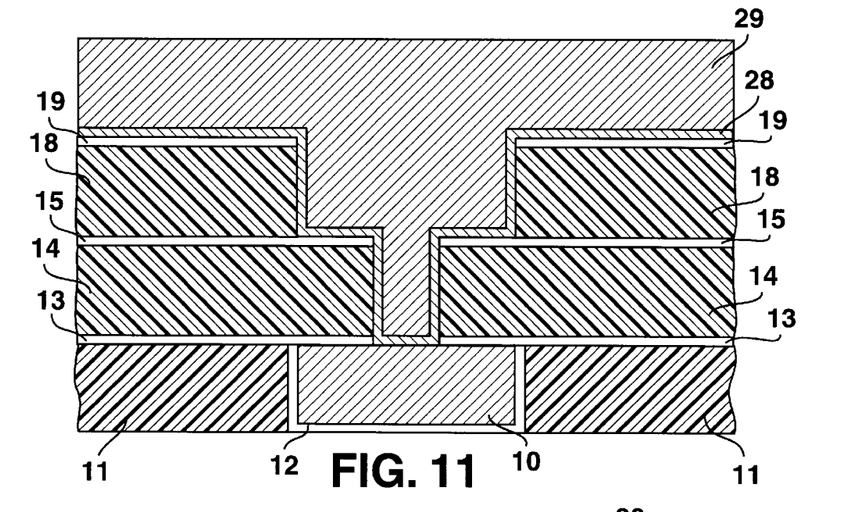
FIG. 11 is a cross-sectional view of a deposition of a conformal barrier layer on the structure shown in FIG. 10 and a subsequent deposition of a conductive material to fill in the via and trench openings.

Then, as shown in FIG. 11, conductive material 29 is deposited to fill in the via and trench openings 24 and 25. In the preferred embodiment, the material deposited is comprised of either copper or aluminum, but it is understood that other metals could be readily used as well. Copper is the more preferred material, due to its enhanced properties over aluminum. In the example, copper is blanket deposited by a known PVD, CVD, plating technique, or a combination of these techniques to fill in the openings 24 and 25. It is appreciated that how the metal is deposited in the openings 24 and 25 is a design choice dependent on the fabrication process being employed.

Generally, when a metallization material is deposited, excess metal forms above the surface of the structure. Accordingly, the conductive material 29 and the barrier material 28 residing above the trench level are removed by either an etching or a polishing technique. In the preferred embodiment, chemical-mechanical polishing (CMP) is used to polish away the excess conductive material above the trench level. In this instance, the dielectric layer 19 functions as a polish-stop layer when CMP is employed. If some or all of the layer 19 is removed during polishing, it poses no detrimental impact on the structure, since layer 19 is no longer required for a subsequent process step.

Furthermore, although layer 19 is described as a dielectric layer and the preference is to have this layer 19 be dielectric, it is possible to employ a metal material for layer 19. In the event layer 19 is a metal layer, then this CMP step will need to remove the remaining layer 19 completely, so that no metal trace remains along the top surface of the structure. Thus, if the layer 19 is dielectric, it can be fabricated into the final structure. However, if the layer 19 is metal, it must be removed completely, so that it will not be fabricated as part of the finished device.

Figure 12:
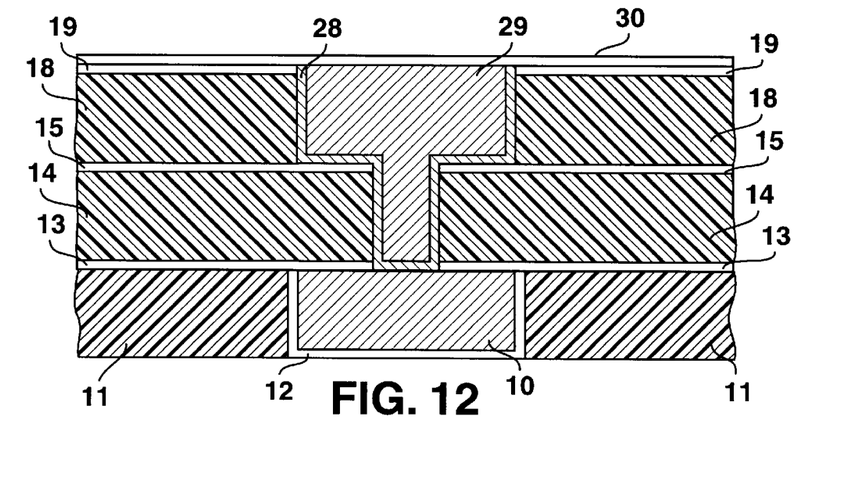
FIG. 12 is across-sectional view showing the removal of the excess barrier layer and conductive materials residing on the surface for the structure of FIG. 11 by performing chemical-mechanical polishing.

Finally, as shown in FIG. 12, another dielectric layer 30 is deposited over the structure to form a final covering layer over the exposed metal material 29 in the trench, as well as over the top surface of the structure (whether layer 19 is present or not). As noted in the Figure, the trench and via are completely filled and fully encapsulated. The dielectric layer 30 is equivalent in material and function to the separation layer 13. That is, the filled trench region now operates as the underlying conductive region (equivalent to region 10) as the process of the present invention is repeated to form another interconnect structure of a subsequent level atop the present metallization level. Thus, by repeating the process, additional interconnect structures can be fabricated to form additional metallization level(s) above the structure shown in FIG. 12.

It is appreciated that the practice of the present invention results in the fabrication of a dual damascene structure, in which dual low-∈ dielectric material layers form the ILD portion of an interconnect. Although a variety of low-∈ dielectric materials can be used for the ILD layers 14 and 18, the preference is to use an organic low-∈ dielectric material. The thickness of the lower layer 14 determines the height of the via, while the thickness of the upper layer 18 determines the height of the trench. Generally, the total ILD height is in the approximate range of 10,000–20,000 angstroms, but this height is a design choice.

In reference to the dielectric layers 13, 15 and 19, the materials selected for these layers should provide sufficient adhesion quality for the particular low-∈ dielectric materials deposited. This is in addition to the properties of these layers described above. Furthermore, it is preferred to use the same low-∈ dielectric material for both of the ILD layers 14 and 18, however, different low-∈ dielectric materials can be used if desired.

Selective Encapsulation of Copper

Figure 13:
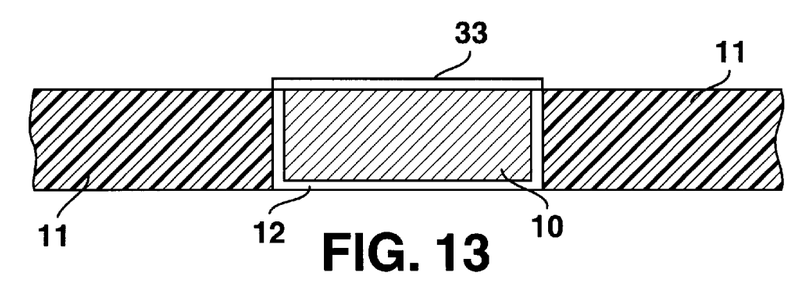
FIG. 13 is a cross-sectional view of a structure of an alternative embodiment that is equivalent to the structure shown in FIG. 2, but in which a conductive barrier layer is selectively deposited only onto the underlying conductive region.

Referring to FIGS. 13–16, an alternative technique for forming a selective covering layer is described for use in copper metallization. Accordingly, the conductive region 10 is comprised of copper for the preferred technique of the alternative embodiment described herein. FIG. 13 shows the foundation structure that is equivalent to the structure shown in FIG. 1. However, in this instance, copper comprises the material for the conductive region 10. Since copper requires isolation from the surrounding dielectric material, the liner layer 12 is a barrier layer. Subsequently, instead of blanket depositing a separation layer 13 over the structure, an encapsulation layer 33 is selectively deposited only over the conductive region 10. The encapsulating layer 33 is a conductive barrier layer, which will then provide an encapsulating (or barrier) cap atop the copper conductive region 10. As shown in FIG. 13, a selective layer 33 is formed atop the conductive region 10, instead of the blanket separation layer 13 (shown in FIG. 2). This encapsulation layer 33 caps the underlying conductive region 10 for the subsequent ILD deposition.

Figure 14:
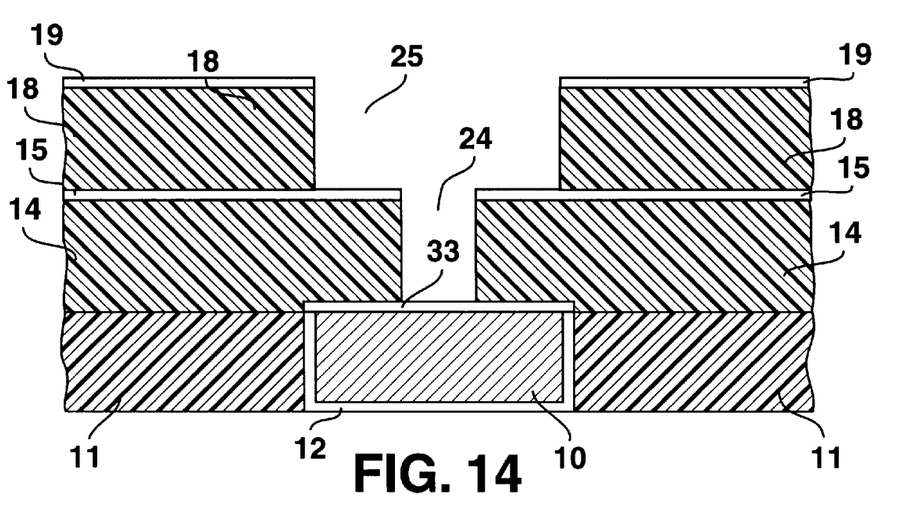
FIG. 14 is a cross-sectional view of a structure that is equivalent to the structure shown in FIG. 10, but in which the selectively deposited conductive barrier layer of FIG. 13 is employed.

The subsequent steps for forming the two low-∈ ILD layers 14 and 18, the two etch-stop layers 15 and 19, and the etching of the via and trench openings 24 and 25 are equivalent to the earlier described steps pertaining to FIGS. 3–10 (with the one exception that layer 33 is selectively formed in place of layer 13). The resulting structure is shown in FIG. 14. The structure of FIG. 14 shows the formation of via and trench openings. The exposed portion of the encapsulation layer 33 at the bottom of the via is not etched and remains in place for the subsequent fills.

Figure 15:
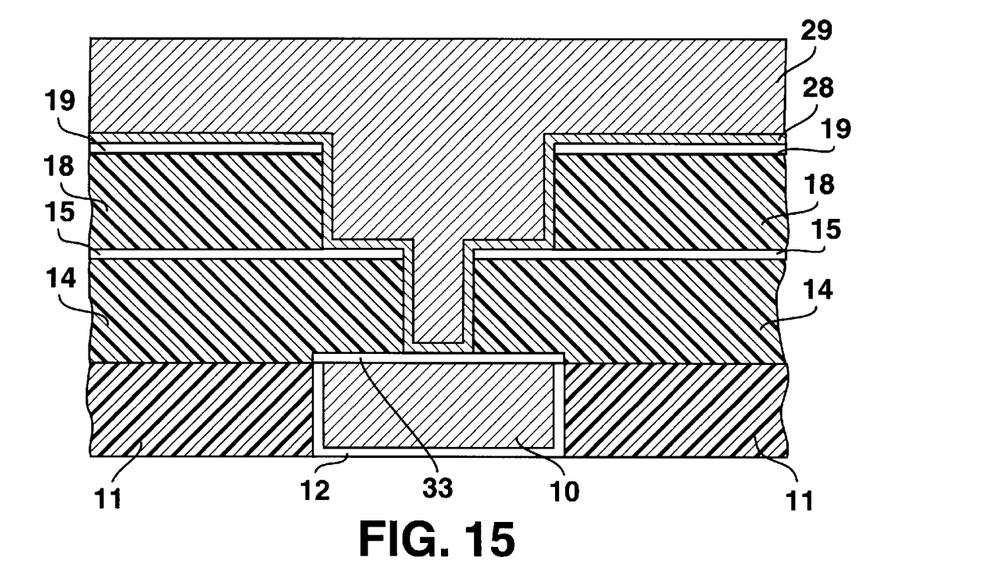
FIG. 15 is a cross-sectional view of a structure that is equivalent to the structure shown in FIG. 11, but in which the selectively deposited conductive barrier layer of FIG. 13 is employed.
Figure 16:
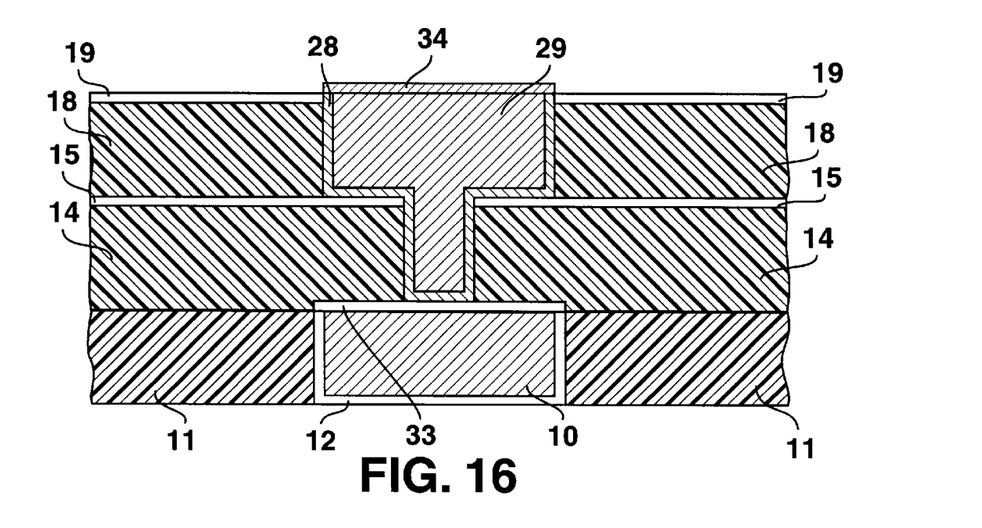
FIG. 16 a cross-sectional view of a structure that is equivalent to the structure shown in FIG. 12, but in which the selectively deposited conductive barrier layer of FIG. 13 is employed.

Then, as shown in FIG. 15, a conforming barrier layer 28 is deposited, followed by a copper deposition, in which the via and trench are copper filled. The structure of FIG. 15 is equivalent to the structure of FIG. 11 (with the exception noted for layer 33), wherein the preferred metal is copper. The subsequent etching or polishing step removes the excess metal material above the surface of the structure. Then, as shown in FIG. 16, another encapsulation layer 34 is selectively formed above the exposed copper in order to fully encapsulate the copper. Again, as previously stated, this encapsulation layer 34 will function as the lower encapsulation layer (equivalent to layer 33) for the next level of metallization.

A variety of techniques can be employed to selectively deposit an encapsulation layer atop the exposed metal region. With the preferred alternative technique employing copper (or copper alloy) as the metal of choice, it is preferred that the layer 33 be a conductive barrier layer. One barrier material for forming the barrier layer 34 (as well as layer 33) is cobalt tungsten phosphide (CoWP). CoWP is selectively deposited onto the exposed copper by a technique of electroless deposition. One technique for performing such CoWP deposition is described in a pending patent application titled "Use Of Cobalt Tungsten Phosphide As A Barrier Material For Copper Metallization;" Ser. No. 08/754,600; filed Nov. 20, 1996. Accordingly, either blanket or selective deposition of the separation layer can be employed in the practice of the present invention.

Thus, a dual damascene interconnect structure using a low dielectric constant material for the dielectric portion of the structure is described. It is appreciated that the technique can be applied to fabricate and manufacture integrated circuit devices on a semiconductor wafer, such as a silicon wafer. It is also appreciated that the technique of the present invention can also be readily adapted to other areas, such as for the manufacture of flat panel displays.

We claim:

1. A process for fabricating a dual damascene integrated circuit on a semiconductor substrate, said process comprising the steps of:

forming with a co-planar upper surface a copper metal line in a dielectric layer;

selectively depositing an etch-stop conductive barrier/encapsulation layer only on said upper surface of said copper metal line;

depositing a first low-∈ ILD dielectric layer over said conductive barrier/encapsulation layer and said dielectric layer;

forming on said first low-∈ ILD dielectric layer a first etch-stop dielectric layer having a defined via opening;

depositing a second low-∈ ILD dielectric layer over said first etch-stop layer;

forming on said second low-∈ ILD dielectric layer a second etch-stop dielectric layer having a defined trench opening;

anisotropically etching said second low-∈ ILD dielectric layer through said trench opening to said first etch stop dielectric layer, and thereafter anisotropically etching said first low-∈ ILD dielectric layer through said via opening to said conductive barrier/encapsulation layer, creating a trench cavity in layer and a via cavity in layer;

forming a conductive barrier layer on said second etch-stop dielectric layer and on the inner surfaces defined by said trench and said via cavities, said conductive barrier layer connecting to said conductive barrier/encapsulation layer;

depositing continuous copper metal to fill the space defined within said conductive barrier layer;

removing excess copper metal and conductive barrier layer material disposed on said second etch-stop dielectric layer, to form a planar surface consisting of an upper surface of said copper metal, horizontal wall tops of said conductive barrier layer and said second etch-stop layer; and selectively depositing an etch-stop conductive barrier/encapsulation layer on said upper surface of said copper metal and said horizontal wall tops of said barrier layer material, thus to fully encapsulate said copper metal.

2. The process of claim 1, wherein said low-∈ material of said deposited first and said second ILD dielectric layers is an organic material.

3. The process of claim 2, wherein said organic material is selected from the group consisting of polyimide, fluorinated polyimide, parylene, poly-arylethers, and fluorinated poly-arylethers.

4. The process of claim 2, wherein the thickness of said first and said second low-∈ dielectric ILD layers is formed to a range of from 5,000 to 10,000 angstroms.

5. The process of claim 3, wherein the thickness of said first and said second low-∈ dielectric ILD layers is formed to a range of from 5,000 to 10,000 angstroms.

6. The process of claim 1, wherein the composition of said selectively deposited conductive barrier/encapsulation layers is cobalt tungsten phosphide.

7. The process in accordance with claim 1, wherein said anisotropic etch step comprises flowing $CH_3F/O_2$ plasma.

8. The process of claim 6, wherein the thickness of said selectively deposited conductive barrier/encapsulation layers is formed to a range of from 300 to 1000 angstroms.

9. The process of claim 1, wherein said conductive barrier/encapsulation layer is formed as a metallic material.

10. The process of claim 1, wherein the composition of said conductive barrier/encapsulation layer is selected from the group consisting of one or more of the materials Ti, TiN, Ta, TaN, W, WN, SiN, WSiN and TaSiN.

11. The process of claim 1, wherein the composition of said first and said second etch-stop dielectric layers is formed of $SiO_2$.

12. The process of claim 11, wherein the thickness of said first and said second etch-stop dielectric layers is formed to within a range of from 300 to 1000 angstroms.

* * * * *